(12) United States Patent
De Geronimo

(10) Patent No.: US 9,551,734 B2
(45) Date of Patent: Jan. 24, 2017

(54) METHOD AND APPARATUS FOR CURRENT-OUTPUT PEAK DETECTION

(71) Applicant: Brookhaven Science Associates, LLC, Upton, NY (US)

(72) Inventor: Gianluigi De Geronimo, Syosset, NY (US)

(73) Assignee: Brookhaven Science Associates, LLC, Upton, NY (US)

( * ) Notice: Subject to any disclaimer, the term of this patent is extended or adjusted under 35 U.S.C. 154(b) by 94 days.

(21) Appl. No.: 14/702,075

(22) Filed: May 1, 2015

(65) Prior Publication Data

US 2015/0316588 A1 Nov. 5, 2015

Related U.S. Application Data

(60) Provisional application No. 61/987,730, filed on May 2, 2014.

(51) Int. Cl.
*G01R 19/04* (2006.01)
*H03K 5/1532* (2006.01)
*G01R 29/08* (2006.01)

(52) U.S. Cl.
CPC ............. *G01R 19/04* (2013.01); *H03K 5/1532* (2013.01); *G01R 29/0857* (2013.01)

(58) Field of Classification Search
USPC ................................. 324/76.11, 103 P, 103 R
See application file for complete search history.

(56) References Cited

U.S. PATENT DOCUMENTS 6,512,399 B1    1/2003  De Geronimo et al.
2012/0181999 A1*  7/2012  Weng ...................... H02M 1/08
                                                    323/282

* cited by examiner

*Primary Examiner* — Vincent Q Nguyen
(74) *Attorney, Agent, or Firm* — Dorene M. Price

(57) ABSTRACT

A method and apparatus for a current-output peak detector. A current-output peak detector circuit is disclosed and works in two phases. The peak detector circuit includes switches to switch the peak detector circuit from the first phase to the second phase upon detection of the peak voltage of an input voltage signal. The peak detector generates a current output with a high degree of accuracy in the second phase.

16 Claims, 3 Drawing Sheets

METHOD AND APPARATUS FOR CURRENT-OUTPUT PEAK DETECTION

This invention was made with Government support under contract number DE-AC02-98CH10886 and DE-SC0012704 awarded by the U.S. Department of Energy. The Government has certain rights in the invention.

FIELD OF THE INVENTION

The present invention relates to peak detection, and more particularly to a method and apparatus for current-output peak detection.

BACKGROUND

FIG. 1 illustrates a block diagram of a prior art front-end circuit for a radiation detector. The circuit includes a low-noise charge amplifier 102, a filter 104, and a peak detector 106. A charge signal Q from a sensor of the radiation detector is amplified by the charge amplifier 102 and filtered by the filter 104, yielding a voltage pulse v(t) with an amplitude proportional to the charge Q. The voltage pulse is processed by the peak detector 106 which yields a constant voltage vp(t) equal to the peak pulse amplitude U. The constant voltage is then processed by further voltage-input processing electronics 108, such as a voltage-input Analog-to-Digital converter.

The peak detector 106 in FIG. 1 is only capable of operating with voltage-input processing electronics 108. If a current-input processing device or circuit is required, such as a current-input Analog-to-Digital converter, a stage which converts the voltage vp(t) into a current is required. Such an additional stage utilizes additional power.

Moreover, in order to maximize the dynamic range of the analog front-end circuit, the peak detector 106 must be able to operate rail-to-rail, i.e. it must be able to process voltages that swing from the minimum (typically ground) supply voltage to the maximum supply voltage, while preserving the required detection precision. Such a rail-to-rail circuit can be affected by non-linear errors due to voltage offsets at the complementary differential input stages, resulting in low-precision peak detection.

In U.S. Pat. No. 6,512,399, which is herein incorporated by reference in its entirety as if fully set forth in this disclosure, G. De Geronimo et al. disclosed a high-precision peak detector capable of operating rail-to-rail by using an offset-cancellation method. However, the disclosed circuit operates with voltage-input processing electronics, and one or more additional stages which precisely convert the voltage vp(t) into a current may be desired. Such additional stage(s), along with utilizing additional power, may be desired to operate with rail-to-rail input voltages but without being affected by non-linear errors due to voltage offsets at the complementary differential input stages.

Therefore, there is a need to develop a peak detector capable of operating with rail-to-rail voltage inputs and providing an output current for operation with current-input processing electronics. There is also a need for a peak detector that is capable of providing high degree of precision peak detection.

SUMMARY

A circuit for processing a received voltage signal is disclosed in the present disclosure. The circuit includes a charge amplifier for amplifying the voltage signal; a filter, coupled with the charge amplifier, receiving and filtering the amplified signal and generating a filtered signal; and a peak detector coupled with the filter at the output terminal of the filter, generating a current output corresponding to the peak voltage amplitude of the received voltage signal.

A current-output peak detector circuit is also disclosed in the present disclosure. According to one embodiment, the peak detector circuit includes an amplifier having a positive input terminal, a negative input terminal, and an output terminal. The positive input terminal of the amplifier is coupled with an input voltage signal through a first switch, the negative input terminal is coupled with a first resistor, the output terminal is coupled with the gate of a hold transistor $M_H$ through a second switch, and the drain of the hold transistor is coupled with a first terminal of a hold capacitor.

The peak detector circuit further includes a first transistor $M_{R1}$. The gate of the first transistor $M_{R1}$ is coupled with the drain of the hold transistor and the gate of a second transistor, the drain of the first transistor $M_{R1}$ is coupled with the negative input terminal of the amplifier, and the second transistor is composed of n1 copies of the first transistor $M_{R1}$ connected in parallel and n1 is an integer. The sources of the first and second transistors and the second terminal of the hold capacitor are coupled to a supply voltage.

The peak detector circuit also includes a reset switch that is connected in parallel with the hold capacitor, and the reset switch is turned off upon, receipt of an input voltage signal at the positive input terminal of the amplifier. The peak detector circuit generates a current output at the drain of the second transistor corresponding to the peak amplitude of the input voltage signal when the first and second switches are turned on and the reset switch is turned off.

According to another embodiment, the current-output peak detector circuit may further include a third transistor $M_{R2}$. The drain of the third transistor $M_{R2}$ is coupled with the positive input terminal of the amplifier through a third switch and with a second resistor, the gate of the third transistor $M_{R2}$ is coupled with the output terminal of the amplifier through a fourth switch and with the gate of a forth transistor. The resistance value of the second resistor is equal to the resistance value of the first resistor, and the third transistor $M_{R2}$ is a copy of the first transistor $M_{R1}$. The fourth transistor comprises n2 copies of the third transistor $M_{R2}$ connected in parallel, and n2 is an integer. The sources of the third and fourth transistors are also coupled to the supply voltage.

According to an embodiment, the current-output peak detector circuit works in two phases. During the first phase, the first switch and the second switch are turned on, and the third and fourth switches are turned off. During the second phase, the first switch and the second switch are turned off and the third and fourth switches are turned on. The fifth switch will be switched off upon receipt of an input voltage signal at the positive input terminal of the amplifier. The peak detector circuit switches from the first phase to the second phase upon detection of the peak voltage of the input voltage signal received at the positive input terminal of the amplifier. In one embodiment, the peak detector circuit switches from the first phase to the second phase by a comparator circuit coupled with the output terminal of the amplifier. During the second phase, the peak detector circuit generates a current output at the drain of the fourth transistor corresponding to the peak amplitude of the input voltage signal.

BRIEF DESCRIPTION OF THE DRAWINGS

For a more complete understanding of the present invention, and for further advantages thereof, reference is now made to the following description taken in conjunction with the accompanying drawings in which.

DETAILED DESCRIPTION

The following discussion is presented to enable a person skilled in the art to make and use of the invention. Various modifications will be readily apparent to those skilled in the art, and the general principles described herein may be applied to embodiments and applications other than those detailed below without departing from the spirit and scope of the present disclosure as defined herein. The present disclosure is not intended to be limited to the embodiments shown, but is to be accorded the widest scope consistent with the principles and features disclosed herein.

Figure 1:
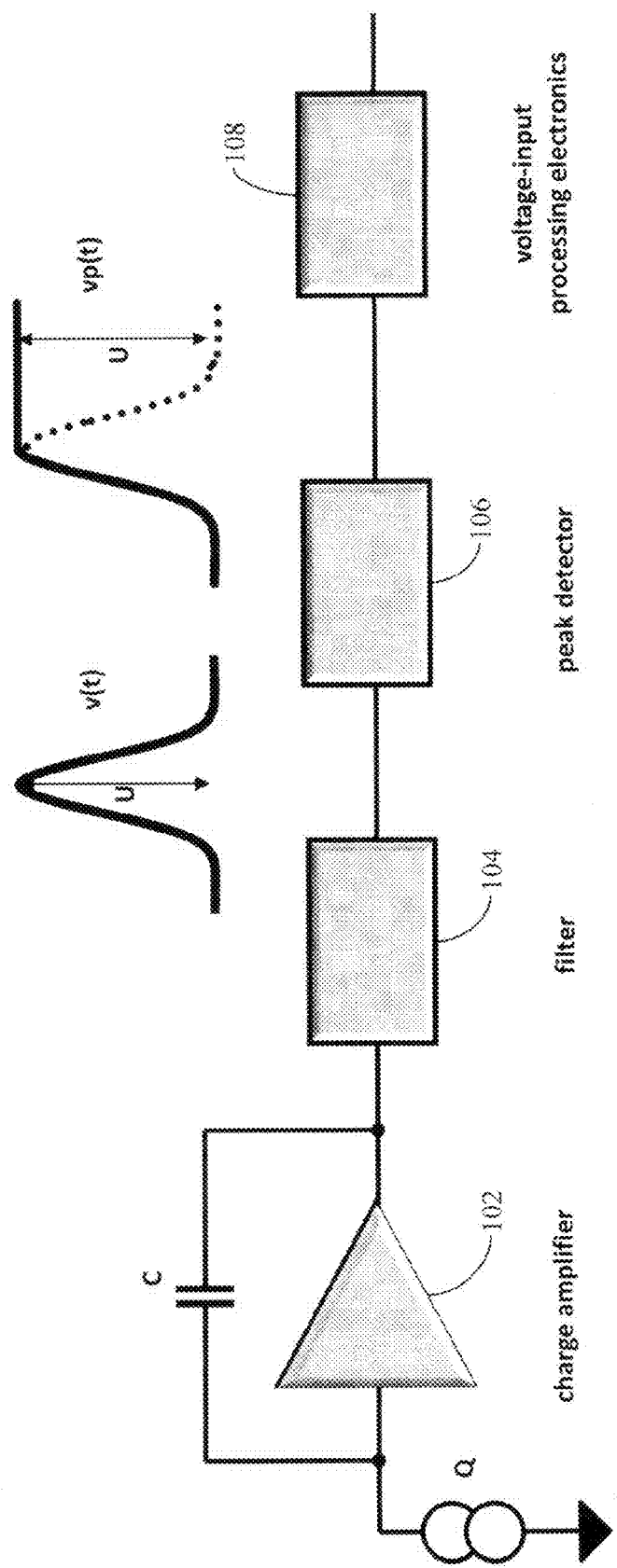
FIG. 1 is a block diagram illustrating a prior art front-end circuit for a radiation detector that includes voltage-input processing electronics.
Figure 2:
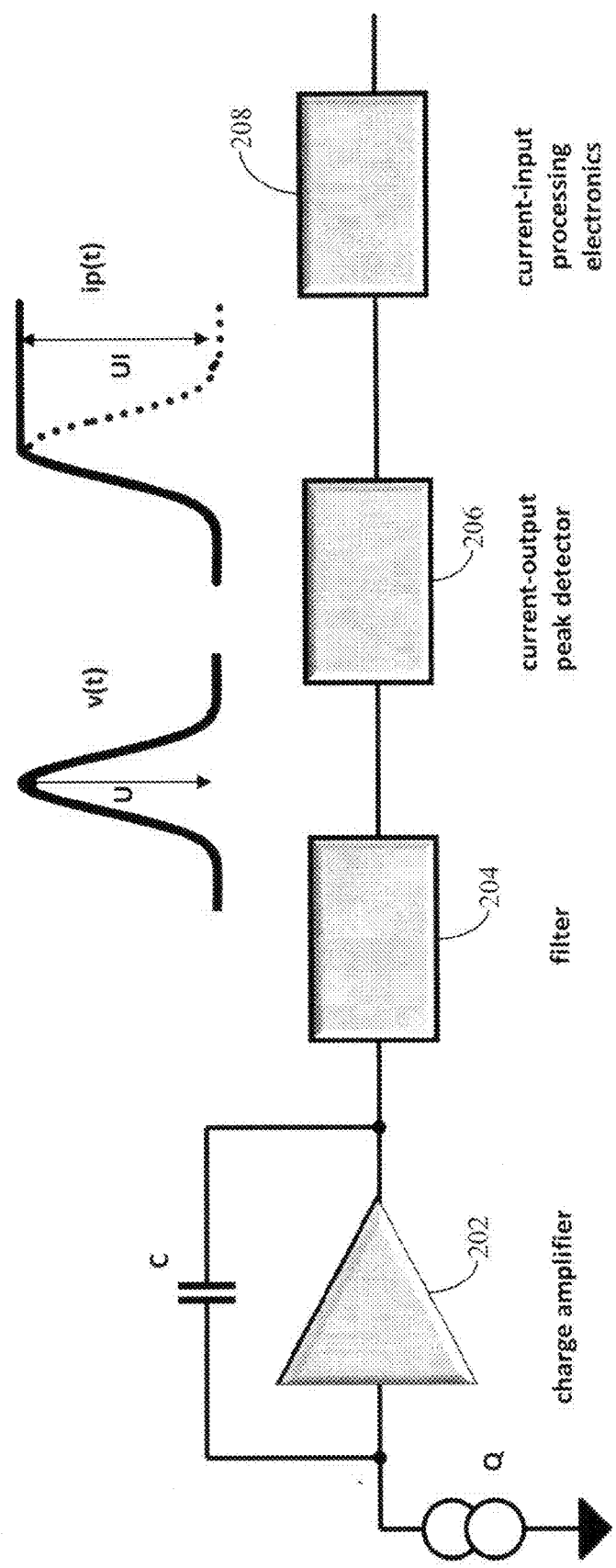
FIG. 2 is a block diagram illustrating a front-end circuit for a radiation detector that includes a current-output peak detector and current-input processing electronics according to an embodiment of the present disclosure.

Referring to FIG. 2, a front-end circuit for a radiation detector according to one embodiment of the present disclosure is illustrated. The circuit includes a low-noise charge amplifier 202, a filter 204, and a current-output peak detector 206. A charge signal Q from a sensor of the radiation detector is amplified by the charge amplifier 202 and filtered by the filter 204, yielding a voltage pulse v(t) with an amplitude proportional to the charge Q and peak voltage amplitude U. The voltage pulse is processed by the current-output peak detector 206 which yields a constant current UI corresponding to the peak voltage pulse amplitude U. The constant current. can then be fed into current-input processing electronics 208 for further processing.

Figure 3:
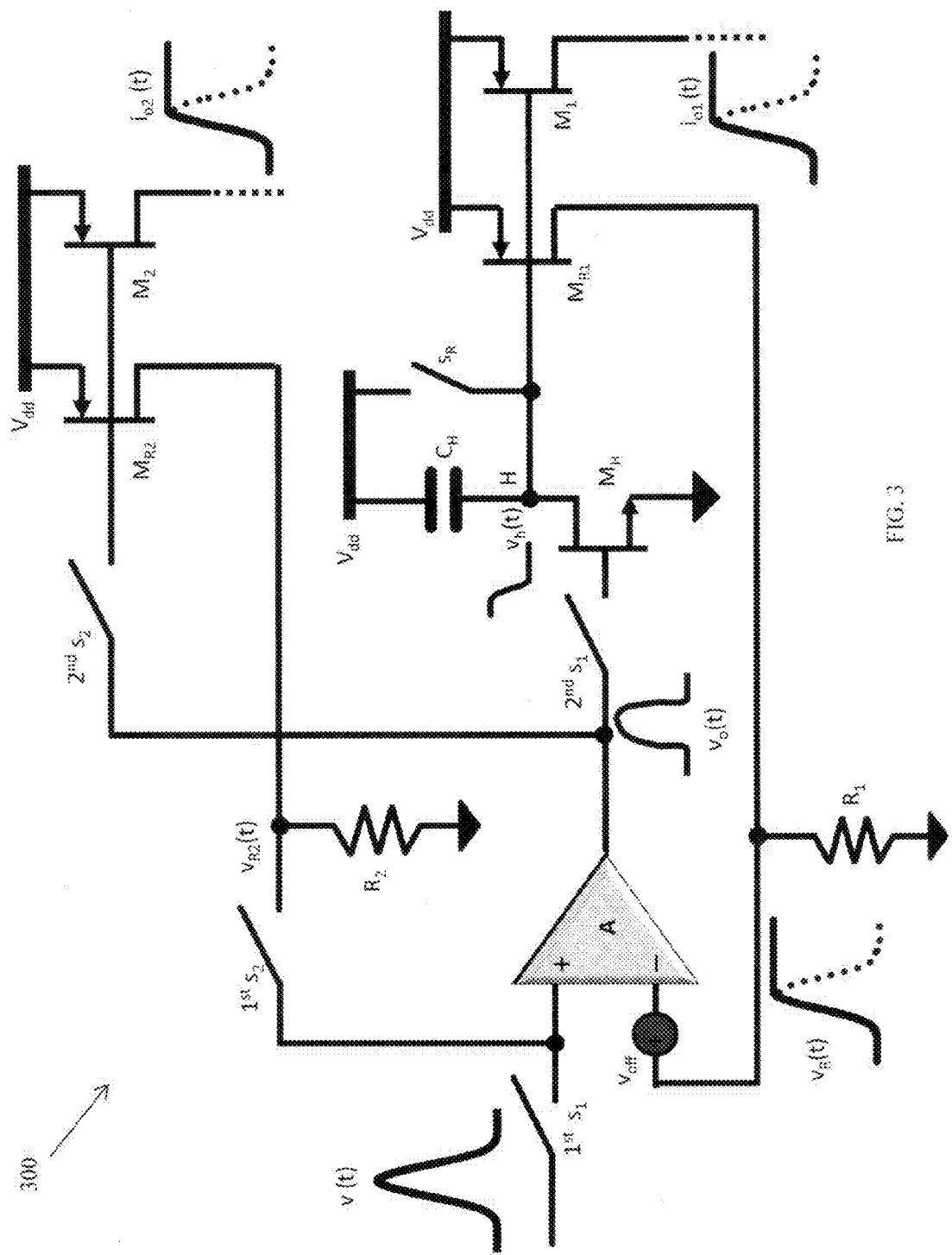
FIG. 3 is a schematic diagram of a current-output peak detector circuit according to an embodiment of the present disclosure.

FIG. 3 illustrates a schematic diagram of circuit 300 of the current-output peak detector 206 according to an embodiment of the disclosure. The circuit 300 may operate in two phases.

During the first phase, switches $S_1$ are closed and switches $S_2$ are open. The positive input terminal of a differential amplifier A is coupled to a voltage input signal v(t) through a first switch $S_1$. For example, the positive input terminal of the amplifier A may be coupled to the output of a filter, such as the filter 204 in FIG. 2, and v(t) is the output signal of the filter. The negative input terminal of the amplifier A is connected to a resistor $R_1$ and to the drain of a transistor $M_{R1}$. The gate of the transistor $M_{R1}$ is connected to a terminal of a hold capacitor $C_H$ and to the drain of a hold transistor $M_H$. The gate of the hold transistor $M_H$ is connected to the output of the amplifier A through a second switch $S_1$ realizing a negative feedback loop around the amplifier A. The gate of the transistor $M_{R1}$ is also connected to the gate of a transistor $M_1$, where the transistor $M_1$ is composed of n1 copies of the transistor $M_{R1}$ connected in parallel, and n1 is an arbitrary integer. The sources of the transistors $M_{R1}$ and $M_1$ are connected to a supply voltage $V_{dd}$, and the other terminal of the hold capacitor $C_H$ is connected to a supply voltage $V_{dd}$.

Before the voltage pulse v(t) arrives, the hold capacitor $C_H$ is discharged to the supply voltage $V_{dd}$ by closing a reset switch $S_R$, which is coupled in parallel with the hold capacitor $C_H$. When the pulse v(t) arrives, the switch $S_R$ is open and the amplifier's output voltage $v_o(t)$ increases. The hold capacitor $C_H$ discharges through the hold transistor $M_H$. Due to the negative feedback, the voltage $v_R(t)$ at the negative input of the amplifier A, which is also the voltage at the resistor $R_1$, tracks the voltage at the positive input of the amplifier A through the current from the transistor $M_{R1}$. It would be apparent to those of ordinary skill of art that a current $i_{o1}(t)$ equal to n1-times the current in the resistor $R_1$ is available at the drain of the transistor $M_1$. In this way the current $i_{o1}(0$ is equal to n1-times $v_R(t)/R_1$, and thus provides a voltage-to-current conversion of the input signal.

As soon as the input pulse reaches its peak voltage, the input voltage starts decreasing. The voltage $v_h(t)$ at node H is held at its minimum value because there is no dc current flowing from the supply voltage $V_{dd}$ to the node H, and the voltage $v_R(t)$ at the resister $R_1$ remains constant at its maximum value, which is the peak value of the input voltage v(t). Therefore, since the negative input of the differential amplifier A is held constant and the positive input starts decreasing, the amplifier A reacts with a sharp decrease at its output voltage $v_o(t)$. The sharp drop at the output voltage refers to a rapidly changing voltage within a timeframe that may be about 2 to 3 orders of magnitude shorter than the time of the input signal. The range of the voltage decrease may depend on the threshold voltage of the hold transistor $M_H$, but may be several hundreds of mV in a few nanoseconds. This sharp decrease in voltage switches off the hold transistor $M_H$. The current $i_{o1}(t)$, which is equal to n1-times $v_R(t)/R_1$, also provides the voltage-to-current conversion of the peak voltage.

The first phase provides peak detection and voltage-to-current conversion at the same time. In the embodiment of FIG. 3, the accuracy of the measurement of the peak voltage is limited by a voltage offset $v_{off}$ at the inputs of the differential amplifier A, which introduces an error between v(t) and $v_R(t)$ by adding a voltage $v_{off}$ to $v_R(t)$. In rail-to-rail input amplifiers, which use complementary differential input stages, the offset voltage $v_{off}$ can be input voltage dependent. For this reason the output current $i_{o1}(t)$, affected by this voltage-dependent error, can only provide a limited measurement accuracy, or is a low-accuracy current output suitable for low-resolution measurements.

In order to correct the amplifier offset, a second phase may be applied. After the peak voltage has been detected, the switches $S_1$ are open and the switches $S_2$ are closed, and the peak detector circuit 300 is switched from the first phase to the second phase. In some embodiments, the switching can be either externally controlled or automatically controlled by a comparator circuit at the output of the amplifier A, which triggers at a sharp falling voltage, that is, at the time a peak voltage is detected. During the second phase, the negative input of the amplifier A remains connected to the peak voltage $v_R(t)$ which is held constant by the constant voltage $v_h(t)$ and by the hold capacitor $C_H$. The positive input of the amplifier A is connected, through a first switch $S_2$, to a resistor $R_2$ which is a copy of the resistor $R_1$, and to the drain of a transistor $M_{R2}$ which is a copy of the transistor $M_{R1}$. The resistor $R_2$ has a resistance value that is equal to that of the resistor $R_1$. At this time, the voltage at the resistor $R_2$, $v_{R2}(t)$, is equal to the voltage $v_R(t)$. The gate of the transistor $M_{R2}$ is coupled to the output terminal of the amplifier A through a second switch $S_2$. The gate of the transistor $M_{R2}$ is also connected to the gate of a transistor $M_2$, which is composed of n2 copies of the transistor $M_{R2}$ connected in parallel, where n2 is an integer. The sources of the transistor $M_{R2}$ and $M_2$ are connected to a supply voltage $V_{dd}$.

The value of the current in the resistor $R_2$ may be equal to the value of the current in the transistor $R_1$ if the offset voltage $v_{off}$ is not considered. The current $i_{o2}(t)$ available at the drain of the transistor $M_2$ may be n2-times the current in the resistor $R_2$ which is equal to $v_{R2}(t)/R_2$. In this way the current $i_{o2}(t)$ is equal to n2-times the current flowing through $R_2$. However, the offset voltage $v_{off}$ previously added to the voltage $v_R(t)$ at the resistor $R_1$ may now be subtracted from the voltage $v_{R2}(t)$, thus canceling the error introduced in phase one. That is, $v_{R2}(t)$ is not affected by the offset error introduced in the first phase. For this reason the output current $i_{o2}(t)$ may provide a higher degree of measurement accuracy, that is, it is a high-accuracy current output suitable for high-resolution measurements.

Therefore, in the embodiment illustrated in FIG. 3, by switching from the first phase to the second phase, the peak detection precision may no longer be limited by the voltage offset $v_{off}$ at the inputs of the differential amplifier A. The circuit 300 may provide a peak detection while also providing voltage-to-current conversion at the same time, i.e., simultaneously. After the high-accuracy current output is generated, the circuit 300 may then be switched back from the first phase to the second phase, where switches $S_1$ and $S_R$ are closed, and switches $S_2$ are open, ready for peak detection of a next pulse signal.

While particular aspects, implementations, and applications of the present disclosure have been illustrated and described, it is to be understood that the present disclosure is not limited to the precise construction and compositions disclosed herein and that various modifications, changes, and variations may be apparent from the foregoing descriptions without departing from the spirit and scope of the disclosed embodiments as defined in the appended claims.

The invention claimed is:

1. A peak detector circuit generating a current output, comprising:
an amplifier having a positive input terminal, a negative input terminal, and an output terminal, the positive input terminal being coupled with an input voltage signal through a first switch, the negative input terminal being coupled with a first resistor, and the output terminal being coupled with a gate of a hold transistor $M_H$ through a second switch, a drain of the hold transistor $M_H$ being coupled with a first terminal of a hold capacitor;
a first transistor $M_{R1}$, a gate of the first transistor $M_{R1}$ being coupled with the drain of the hold transistor $M_H$ and a gate of a second transistor, a drain of the first transistor $M_{R1}$ being coupled with the negative input terminal of the amplifier, wherein the second transistor comprise n1 copies of the first transistor $M_{R1}$ coupled in parallel and n1 is an integer;
a third transistor $M_{R2}$, a drain of the third transistor $M_{R2}$ being coupled with the positive input terminal of the amplifier through a third switch and with a second resistor, the gate of the third transistor $M_{R2}$ being coupled with the output terminal of the amplifier through a fourth switch and with a gate of a fourth transistor, wherein the third transistor $M_{R2}$ is a copy of the first transistor $M_{R1}$, a resistance value of the second resistor is equal to a resistance value of the first resistor, the fourth transistor comprises n2 copies of the third transistor $M_{R2}$ coupled in parallel, and n2 is an integer;
a fifth switch connected in parallel with the hold capacitor;
wherein sources of the first, second, third and fourth transistors are coupled to a supply voltage, and a second terminal of the hold capacitor is coupled to the supply voltage;
wherein the first switch, the second switch and the fifth switch are turned on, and the third and fourth switches are turned off;
wherein the fifth switch is turned off upon receipt of the input voltage signal at the positive input terminal of the amplifier;
wherein the first switch and the second switch are turned off, and the third and fourth switches are turned on upon detection of a peak voltage of the input voltage signal; and
wherein the peak detector generates the current output at a drain of the fourth transistor corresponding to a peak voltage amplitude of the input voltage signal.

2. The peak detector circuit of claim 1, wherein the first switch and the second switch are turned off, and the third and fourth switches are turned on by a comparator circuit.

3. The peak detector circuit of claim 2, wherein the comparator circuit is coupled to the output terminal of the amplifier.

4. A circuit for processing a voltage signal, comprising:
a charge amplifier for amplifying the voltage signal;
a filter, coupled with the charge amplifier, receiving and filtering the amplified voltage signal and generating a filtered signal; and
a peak detector coupled with the filter at an output terminal of the filter,
generating a current output corresponding to a peak voltage amplitude of the voltage signal, the peak detector comprising:
an amplifier having a positive input terminal, a negative input terminal, and an output terminal, the positive input terminal being coupled with the filtered signal through a first switch, the negative input terminal being coupled with a first resistor, and the output terminal being coupled with a gate of a hold transistor $M_H$ through a second switch, a drain of the hold transistor $M_H$ being coupled with a first terminal of a hold capacitor;
a first transistor $M_{R1}$, a gate of the first transistor $M_{R1}$ being coupled with the drain of the hold transistor $M_H$ and a gate of a second transistor, a drain of the first transistor $M_{R1}$ being coupled with the negative input terminal of the amplifier, wherein the second transistor comprise n1 copies of the first transistor $M_{R1}$ connected in parallel and n1 is an integer; and
a third transistor $M_{R2}$, a drain of the third transistor $M_{R2}$ being coupled with the positive input terminal of the amplifier through a third switch and with a second resistor, the gate of the third transistor $M_{R2}$ being coupled with the output terminal of the amplifier through a fourth switch and with a gate of a fourth transistor, wherein a resistance value of the second resistor is equal to a resistance value of the first resistor, the third transistor $M_{R2}$ is a copy of the first transistor $M_{R1}$, the fourth transistor comprises n2 copies of the third transistor $M_{R2}$ connected in parallel, and n2 is an integer.

5. The circuit of claim 4, further comprising a current-input processing circuit coupled with the peak detector.

6. The circuit of claim 4, further comprising a current-input analog-to-digital convertor coupled with the peak detector.

7. The circuit of claim 4, wherein the current output is generated at a drain of the fourth transistor corresponding to the peak amplitude of the voltage signal.

8. A peak detector circuit generating a current output, comprising:

an amplifier having a positive input terminal, a negative input terminal, and an output terminal, the positive input terminal being coupled with an input voltage signal through a first switch, the negative input terminal being coupled with a first resistor, and the output terminal being coupled with a gate of a hold transistor $M_H$ through a second switch, a drain of the hold transistor $M_H$ being coupled with a first terminal of a hold capacitor;

a first transistor $M_{R1}$, a gate of the first transistor $M_{R1}$ being coupled with the drain of the hold transistor $M_H$ and a gate of a second transistor, a drain of the first transistor $M_{R1}$ being coupled with the negative input terminal of the amplifier, wherein the second transistor comprises n1 copies of the first transistor $M_{R1}$ connected in parallel and n1 is an integer; and a reset switch connected in parallel with the hold capacitor;

wherein sources of the first and second transistors and a second terminal of the hold capacitor are coupled to a supply voltage.

9. The peak detector circuit of claim 8, wherein the peak detector circuit generates the current output at a drain of the second transistor corresponding to a peak amplitude of the input voltage signal when the first and second switches are turned on and the reset switch is turned off.

10. The peak detector circuit of claim 8, wherein the reset switch is turned off upon receipt of the input voltage signal at the positive input terminal of the amplifier.

11. The peak detector circuit of claim 8, further comprising:

a third transistor $M_{R2}$, a drain of the third transistor $M_{R2}$ being coupled with the positive input terminal of the amplifier through a third switch and with a second resistor, a gate of the third transistor $M_{R2}$ being coupled with the output terminal of the amplifier through a fourth switch and with a gate of a fourth transistor, wherein the third transistor $M_{R2}$ is a copy of the first transistor $M_{R1}$, a resistance value of the second resistor is equal to a resistance value of the first resistor, the fourth transistor comprises n2 copies of the third transistor $M_{R2}$ connected in parallel, and n2 is an integer;

wherein sources of the third and fourth transistors are coupled to the supply voltage.

12. The peak detector circuit of claim 11, further comprising a first phase, the first switch and the second switch being turned on during the first phase, and the third and fourth switches being turned off during the first phase.

13. The peak detector circuit of claim 11, further comprising a second phase, the first switch and the second switch being turned off during the second phase, and the third and fourth switches being turned on during the second phase.

14. The peak detector circuit of claim 11, further comprising a first phase and a second phase, wherein the peak detector circuit switches from the first phase to the second phase upon detection of a peak voltage of the input voltage signal received at the positive input terminal of the amplifier.

15. The peak detector circuit of claim 11, further comprising a first phase and a second phase, wherein the peak detector circuit switches from the first phase to the second phase by a comparator circuit coupled with the output terminal of the amplifier.

16. The peak detector circuit of claim 11, wherein the peak detector circuit generates a current output at a drain of the fourth transistor corresponding to a peak amplitude of the input voltage signal.

* * * * *